Nov. 18, 1952 B. A. SCHWARZ 2,618,770

LIMIT CONTROL FOR ELECTRIC MOTORS

Filed Sept. 16, 1948 2 SHEETS—SHEET 1

Inventor

Bertram A. Schwarz

By

Spencer, Willits, Helwig & Baillio

Attorneys

Nov. 18, 1952 B. A. SCHWARZ 2,618,770

LIMIT CONTROL FOR ELECTRIC MOTORS

Filed Sept. 16, 1948 2 SHEETS—SHEET 2

Inventor

Bertram A. Schwarz

By

Spencer, Willits, Helwig & Baillio

Attorneys

Patented Nov. 18, 1952

2,618,770

UNITED STATES PATENT OFFICE 2,618,770

LIMIT CONTROL FOR ELECTRIC MOTORS

Bertram A. Schwarz, Kokomo, Ind., assignor to General Motors Corporation, Detroit, Mich., a corporation of Delaware Application September 16, 1948, Serial No. 49,606

11 Claims. (Cl. 318—467)

The present invention relates to indexing devices and particularly to radio receiver tuners of the type designed to automatically tune the receiver to a plurality of preselected frequencies in sequence.

The majority of sequential tuners include either manually or electromagnetically operated mechanical indexing devices. These tuning devices are subject to certain difficulties which are overcome in the present invention. They are inconvenient to reset and have a predetermined number of indexed positions. If the radio receiver is located in a locality where only a few radio stations may be received, certain of the indexed positions must be left blank or if the radio receiver is located in a locality where a very large number of radio stations may be received, the operator must select only the number of stations corresponding to the number of index positions which this tuner has.

A very large majority of the automobiles in use today are equipped with broadcast radio receivers and thus a high percentage of radio receivers are continually being transferred from one radio broadcast area to another. This change from one area to another of course necessitates the setting up of an entirely new set of radio frequencies on the tuner. The present invention makes it very simple to reset a receiver tuner accurately to new preselected frequencies.

It is therefore an object of the present invention to produce a radio receiver tuning means capable of being readily set to a large number of indexed positions.

It is also an object of the present invention to produce an indexing device having any desired number of positions.

It is a further object of the present invention to produce an automatic tuning device for a radio receiver having provision for indicating the call letters of the station to which the set is tuned.

It is a further object of the present invention to produce an economical, accurate and simple automatic tuning device.

Referring to the figures in the drawings.

Figure 1:
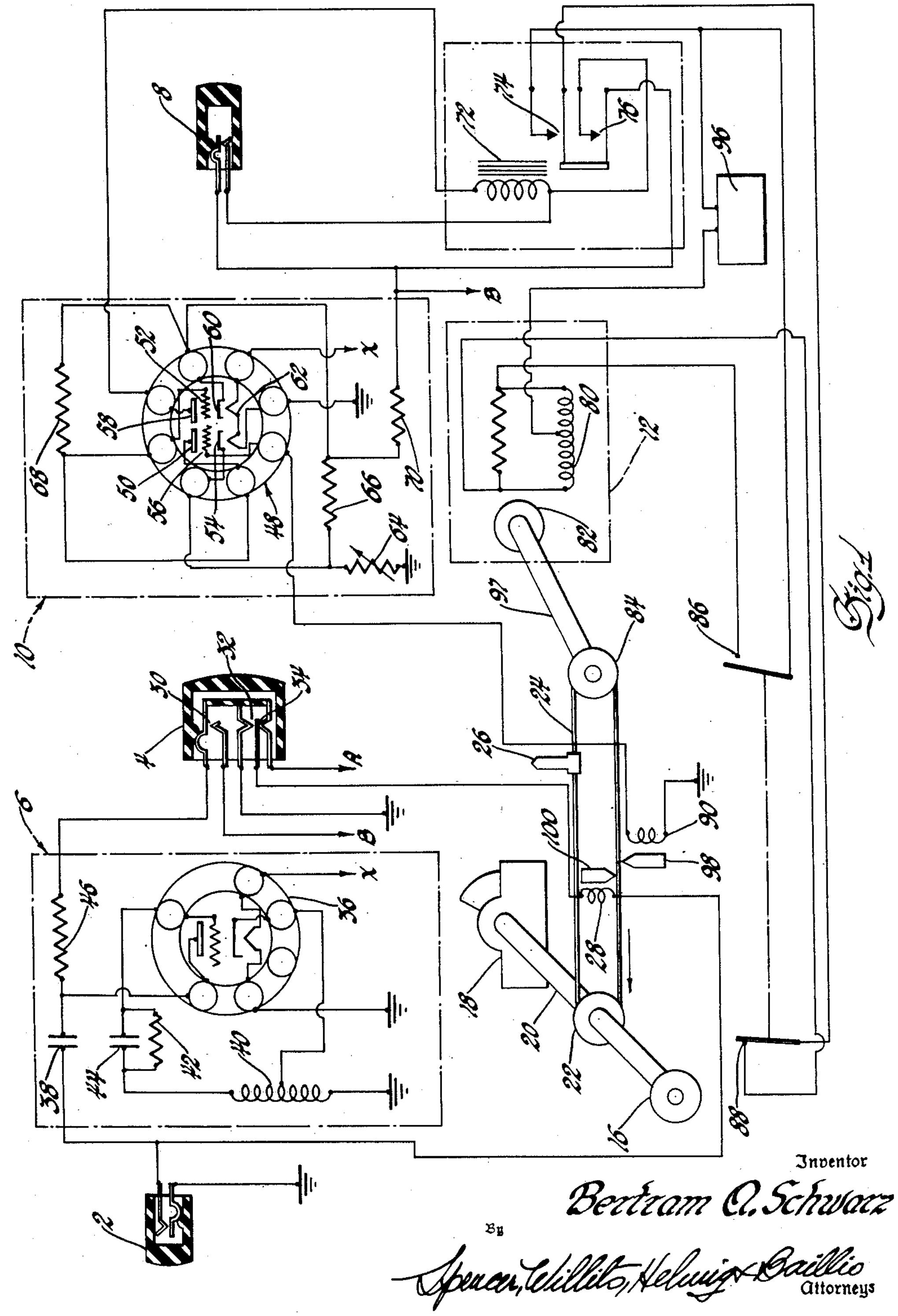
Figure 1 is a schematic diagram showing one modification of the present invention.

To accomplish the objects of the present invention, I propose to use a wire or tape which moves across a magnetize-erase head and a pickup head as the tuning means is actuated. The user may set the desired station frequency on the tuner by manually tuning the set to this station and pressing a button to energize the magnetize-erase coil and thereby magnetize a small area of the tape or wire. He would do this at the "in tune" point for each station he wishes to set up on the tuner. After he has the desired stations set up, the user may tune in the stations by depressing a button energizing the tuning motor which in turn drives the tuning means and the magnetic wire or tape. The first magnetized spot on the wire or tape arriving at the pickup head serves to stop the motor. The energy picked up when the magnetized spot on the tape passes over the pickup coil is used to operate a control circuit which in turn operates a relay breaking the motor circuit and stopping the tuning means. Depressing the station selector push button will restart the tuning motor which will run until another magnetized spot passes over the pickup coil. The actual tuning operation is accomplished with the wire or tape traveling only in one direction. When the tuner reaches the extreme end of travel in that direction, a limit switch at that end is thrown and the motor reverses. The tuning means ignores the magnetized spots on the tape in this reverse direction and the tuner returns to the opposite end of its limit of travel where another limit switch is thrown. The motor then operates as before until a magnetized spot on the tape passes over the pickup head. There is a spacing between the pickup coil and the magnetize-erase coil which allows for the amount of coasting inherent in the tuning means and thus properly tunes to the station frequency at the end of the coast.

To erase the magnetized spots, a push button is depressed which applies plate potential to a fixed oscillator operating at a high frequency. This signal is then applied through a coupling condenser to the magnetize-erase coil to remove the magnetization at that point on the tape. Having thus described the general operation of the present invention, I refer to Figure 1 of the drawings.

In this figure, 2 is a tape magnetizing push button. The depression of this button closes a circuit from the D. C. potential marked A through a magnetize-erase coil 28 to ground thus magnetizing a point on the magnetic tape or wire 24. 4 is the erase button and the depression of this button closes the switches 30 and 32 and opens the switch 34. This applies plate potential from the high voltage source B to the plate of the oscillator tube 36 which is part of a fixed high frequency oscillator shown generally as 6.

The oscillator 6 is of conventional design. The tuned circuit of this oscillator includes condenser 38, coil 40 and coil 28. The resonant frequency of this circuit is not critical but should be in a range that would not cause any interference or disturbing beat frequencies with either the radio frequencies, the intermediate frequency, or the audio frequencies of the radio receiver. It has a grid bias circuit including condenser 44 and resistor 42. It also has a plate load resistor 46.

The circuit generally indicated as 10 may be considered as a motor control circuit. It is what might be termed a "one shot" multivibrator or "flip-flop" circuit. It includes a twin triode so connected that the two halves of the twin triode may not be conducting at the same time. One of the triodes includes a cathode 54, a grid 56 and a plate 50. The other triode has a cathode 60, a grid 52 and a plate 58. Both of these triode electrode systems have a common heater filament 62. Both of the cathodes 54 and 60 are biased by a circuit including resistors 64, 66 and 70, resistor 64 of which is variable. The cathode 60 is normally biased to considerably higher potential than the cathode 54 as will be readily apparent by noting the positions on the biasing circuit to which these cathodes are connected. The grid 56 is connected to ground through the coil 90 and under conditions when no signal is being produced by the coil 90, this triode is biased below cutoff and therefore no current flows through the plate 50. Under these conditions no current flows through the resistor 68 and therefore the grid 52 and the cathode 60 are biased to the same potential. Therefore, this triode under the conditions of no signal from coil 90 is in a condition to conduct when a voltage of sufficient potential is placed on the plate 58. This circuit is set in operation by the momentary closing of switch 8 thus placing the voltage on the plate 58 from the power supply B through the relay coil 72. The energization of this relay coil 72 closes contacts 74 and 76. The contact 76 is a holding contact which maintains a circuit from the power supply B to the plate 58 thus keeping the coil 72 energized after the switch 8 is opened. The coil 72 is thus energized and the contacts 74 and 76 held in the closed position as long as the plate 58 is conducting current. The contact 74 closes the circuit from the conventional power supply 96 through one-half of the coil 80 of the electric motor 12 and thus causes rotation of the armature 82 of this motor as long as the limit switch 88 is maintained in a closed position. This motor may of course be a spring wound motor with appropriate speed governor and electrical stopping circuits. The operation of the switch 88 and also that of 86 will be discussed more in detail later in the specification. The armature 82 drives the magnetic wire or tape pulley 84 through a drive shaft 97. This drive shaft 97 of course may be driven by reduction gear without departing from the scope of this invention. The energization of this motor through the switch 88 causes the armature to turn in a clockwise direction thus moving the magnetic wire or tape 24 and through this wire or tape the pulley 22 moves the tuning condenser 18. This motion continues until a spot on the tape or wire 24, which has been previously magnetized as described above, approaches the core of magnetic material 98 which is associated with coil 90. When this magnetized area approaches the core 98 an electrical current is induced in the coil 90 thus placing a signal on the grid 56 of the twin triode 48. The constants of the circuit are so designed that this signal is sufficient to allow the conduction of current between the plate 50 and the cathode 54. A current is caused to flow through the resistor 68 by the plate conduction current. This current causes the grid 52 to be biased to cutoff potential and thus stop the flow of current from the plate 58 to the cathode 60. With this interruption of current the magnetic coil 72 is de-energized, thus allowing the contacts 74 and 76 to open. This de-energizes field coil 80 of the motor 12 thereby stopping rotation of the armature 82. This armature will coast a predetermined amount before stopping and this amount of coasting is compensated for by the spacing of the core 98 with respect to the core 100. At this point the radio receiver is tuned in to the preset frequency and it is necessary to close the switch 8 to restart the tuning cycle.

Because of the necessity for allowing a certain amount of coasting time, the present tuner operates only when the motor armature 82 is traveling in a clockwise direction. When the indicator 26 reaches the upper end of the radio's received frequency range, the limit switches 86 and 88 are actuated simultaneously closing the switch 86 and opening the switch 88. The switch 86 closes the circuit from the power source 96 through the other half of the field coil 80 thus causing the armature 82 to rotate in a counter-clockwise direction. This circuit is controlled only by the limit switch 86 and therefore is insensitive to the rest of the tuning circuit and will not respond to any magnetized areas in the tape 24 on this return stroke. When the pointer 26 has reached the extreme left end of its travel, it is again at the lower end of the frequency band and the limit switch 88 will be closed and the switch 86 opened. The tuner is then in a position to start its tuning sweep.

Figure 2:
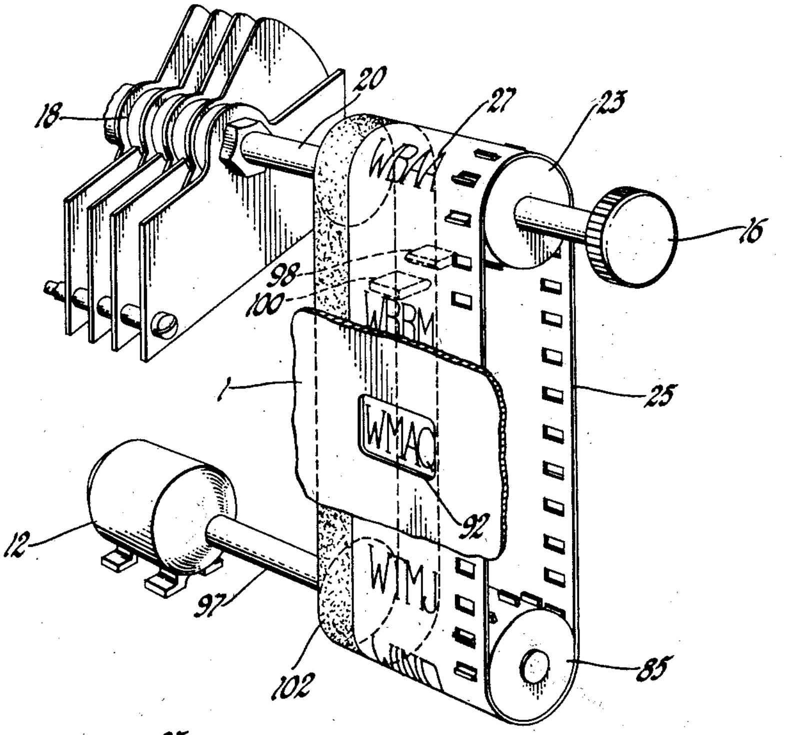
Figure 2 is a view showing the mechanical details of one modification of the present invention.
Figure 3:
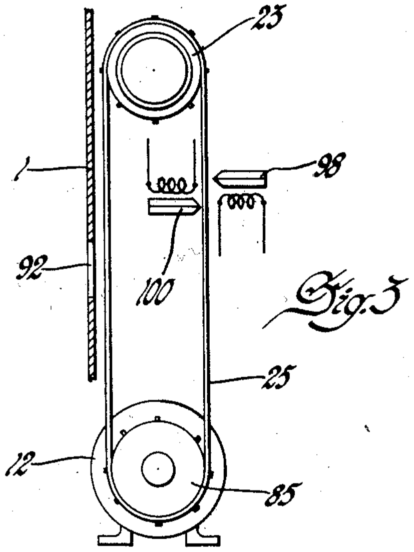
Figure 3 is an end view of Figure 2.

Referring to Figures 2 and 3, a specific modification of the present invention is illustrated. In this modification an endless film 25 with a band 102 of magnetic material replaces the magnetic wire or tape 24 with pointer 26 illustrated in Figure 1. In these figures, as in Figure 1, 18 represents a tuning reactance which may be a gang of variable condensers or a gang of variable inductances suitable to tune the resonant circuits in the receiver. This tuning reactance is mechanically operated through a shaft 20 which may be actuated either by the drum 23 in automatic or by the knob 16 in manual control. The drum 23 is driven by the endless tape 25 from a drum 85 which is mechanically actuated as in Figure 1 by a shaft 97. This shaft, as in Figure 1, is driven by a reversible electric motor 12. The tape 25 is manufactured of material upon which the operator may mark radio call letters such as shown at 27. The cores 98 and 100 illustrated in these two figures perform the same function as cores likewise designated in Figure 1.

*Operation*

The operator of the radio receiver set desiring to use the apparatus which is the subject of this invention manually tunes the radio to a desired station by means of knob 16. With the mechanism in this position he then closes the switch 2 causing direct current to flow through the coil 28 from the source of D. C. marked A thus magnetizing that portion of the tape or wire directly opposite the core 100. The operator may repeat this sequence of operations for any number of station frequencies and thus set upon the magnetic tape or wire any number of magnetized areas. If the operator should desire to eliminate any of these magnetized areas and thus remove that station frequency set up on the magnetic wire, he may do this easily by means of oscillator 6. The radio receiver is tuned to the magnetized area corresponding to an undesired frequency. While in this position the operator depresses the button 4 thus opening contact 34 and closing contacts 30 and 32. This places a plate voltage on the oscillator 6 and connects the coil 28 in the oscillator circuit so that an alternating current is produced in the coil 28. This alternating current by its decay when the button 4 is released effectively demagnetizes the area in the tape or wire directly below the core 100.

After magnetizing the wire or tape in the desired locations, the operator may sequentially tune in the station frequencies corresponding to these magnetized areas by closing the switch 8. The operator momentarily closes the switch 8 thus energizing the coil 72 which closes the switches 74 and 76. The switch 76 maintains the coil 72 energized after the opening of the switch 8 and the motor 12 drives the tuning reactance until a magnetized area approaches the core 98. The approach of the magnetized area to the core 98 causes a momentary pulse to be generated on the grid 56 thus causing the plate 59 to conduct current as described previously, thus causing the grid 52 to be so biased as to stop conduction by the plate 58. This operation is repeated and the stations previously set up on the magnetic tape are tuned in sequentially until the tuning mechanism reaches its limit of travel and the limit switch 88 is opened and 86 closed. The motor 12 then reverses, driving the tuning mechanism to its opposite limit of travel. At that time the switch 88 is closed and the switch 86 opened. The tuning cycle may then be repeated.

The operator, if he so desires, may mark the stations 27 on the tape so that they are visible through the window 92 of the cabinet 1 when that station is in tune. These stations may of course be previously marked by the manufacturer of the equipment if it is considered desirable.

The operator may skip over stations that are set up on the equipment by maintaining the switch 8 closed so as to over-ride any pulses which may be generated in the coil 99 by the magnetized areas on the tape or wire.

The present invention may also be utilized for sequentially tuning stations of a given classification, for example, stations carrying the same chain program or stations of the same geographic location. To accomplish this result it would only be necessary to replace the single tape or wire with a series of tapes or wires each one having stations of a given classification indexed thereon. With such a combination one could select the tape and hence the station classification (for example, stations of the NBC network) by means of a switch and thereafter tune in the stations of this specific classification sequentially utilizing the magnetized index areas on the tape for stopping the tuning mechanism on the desired station. Another system for accomplishing this same result is shown in my copending application S. N. 3,050, filed January 19, 1948, now Patent No. 2,521,752, dated September 12, 1950.

It is to be understood also that although the invention has been described with specific reference to a particular embodiment thereof, it is not to be so limited, since changes and alterations therein may be made which are within the full intended scope of this invention as defined by the appended claims.

I claim:

1. A tuning mechanism for radio signal receivers; including an adjustable tuning reactance capable of tuning the receiver to a preselected radio frequency, a motor capable of driving said tuning reactance, a source of power for said motor, an electrical circuit between said source of power and said motor, means for closing said electrical circuit to start said motor, an element containing magnetic material synchronized with said tuning reactance and also driven by said motor, means for magnetizing an area on said element corresponding to said preselected radio frequency, a pickup coil located in close proximity to said element and capable of generating an electrical signal from the change in the magnetic field adjacent said coil caused by a magnetized area of said magnetic material approaching said pickup coil, and means responsive to said electrical signal for opening the electrical circuit between said power source and said motor to stop the movement of the latter.

2. A tuning mechanism as claimed in claim 1 having means for demagnetizing the previously magnetized area of the element containing magnetic material, said means including an alternating current generator.

3. A tuning mechanism as claimed in claim 1 in which the element containing magnetic material is a flat tape with identifying marks of the call letters of radio broadcast stations thereon in the same spaced relation as the magnetized areas to indicate the station tuned in to the operator.

4. An indexing device including; mechanism to be indexed, a motor capable of driving said mechanism, a source of power for said motor, an electrical circuit between said source of power and said motor, means for closing said electrical circuit to start said motor, an element containing magnetic material carried by said mechanism, means for magnetizing preselected areas of said element, a pickup coil located in close proximity to said element and capable of generating an electrical signal from the change in the magnetic field adjacent said coil caused by a magnetized area of said magnetic material approaching said pickup coil, and means responsive to said electrical signal for opening the electrical circuit between said power source and said motor to stop the movement of the latter.

5. An indexing device as claimed in claim 4 having means for demagnetizing the previously magnetized areas of the element containing magnetic material, said means including an alternating current generator.

6. An indexing device as claimed in claim 4 in which the element containing magnetic material is a flat tape with identifying marks of index positions thereon in the same spaced relation as the magnetized areas to indicate the station being received.

7. In a tuning mechanism for radio receivers, an adjustable tuning reactance capable of tuning the receiver over a predetermined band of radio frequencies, driving means for moving the reactance, control means for starting and stopping the driving means, an elongated element containing magnetizable material synchronized for movement with the tuning reactance and driven therewith, said element containing a plurality of spaced magnetized areas corresponding to locations of the adjustable reactance to index the same to receive desired stations, inductance means located in close proximity to the element at one point in which electric signals are generated by the approach of one of the magnetized areas, and conductive means interconnecting said inductive means and the control means so that an induced signal in the inductive means will actuate the control means and stop the driving means.

8. In a tuning mechanism for radio receivers, an adjustable tuning reactance capable of tuning the receiver over a predetermined band of radio frequencies, driving means for moving the reactance, control means for starting and stopping the driving means, an elongated element containing magnetizable material synchronized for movement with the tuning reactance and driven therewith, means mounted adjacent the element at a given point for magnetizing an area thereof when the reactance is adjusted to receive a given station, inductance means mounted adjacent the element at a second point in which signals are generated by the approach of any one of such previously magnetized areas, and conductive means connecting the inductance means to the control means so that the latter will be actuated to stop the driving means upon receipt of a signal at the inductance means.

9. In a tuning mechanism for radio receivers, an adjustable tuning reactance capable of tuning the receiver over a predetermined band of radio frequencies, driving means for moving the reactance, control means for starting and stopping the driving means, an elongated element containing magnetizable material synchronized for movement with the tuning reactance and driven therewith, said element containing a plurality of spaced magnetized areas corresponding to locations of the adjustable reactance to index the same to receive desired stations, inductance means located in close proximity to the element at one point in which electric signals are generated by the approach of one of the magnetized areas, conductive means interconnecting said inductive means and the control means so that an induced signal in the inductive means will actuate the control means and stop the driving means and means, for demagnetizing previously magnetized areas of said element so that the program and predetermined settings can be changed.

10. In a tuning mechanism for radio receivers, an adjustable tuning reactance capable of tuning the receiver over a predetermined band of radio frequencies, driving means for moving the reactance, control means for starting and stopping the driving means, an elongated element containing magnetizable material synchronized for movement with the tuning reactance and driven therewith, means mounted adjacent the element at a given point for magnetizing an area thereof when the reactance is adjusted to receive a given station, inductance means mounted adjacent the element at a second point in which signals are generated by the approach of any one of such previously magnetized areas, conductive means connecting the inductance means to the control means so that the latter will be actuated to stop the driving means upon receipt of a signal at the inductance means, and means for demagnetizing previously magnetized areas of said element so that the program and predetermined settings can be changed.

11. In a tuning mechanism for radio receivers, an adjustable tuning reactance capable of tuning the receiver over a predetermined band of radio frequencies, driving means for moving the reactance, control means for starting and stopping the driving means, an elongated element containing magnetizable material synchronized for movement with the tuning reactance and driven therewith, a coil mounted adjacent the element at one point, a source of direct current, an alternating current oscillator, switching means for connecting either the source of D. C. to the coil or the oscillator, the first for applying magnetized areas to the element at desired points of index and the second for erasing from the element magnetized areas when they are no longer desired to change the program, a pick-up coil also mounted adjacent the element at a given point in which a signal is induced by the approach of one of the magnetized areas, and control means to stop and start the driving means connected to the pick-up coil actuated by the signal to stop the driving means upon the appearance of a signal at the pick-up coil.

BERTRAM A. SCHWARZ.

REFERENCES CITED

The following references are of record in the file of this patent:

UNITED STATES PATENTS

| Number | Name | Date |
|---|---|---|
| 2,304,871 | Andrews | Dec. 15, 1942 |
| 2,313,136 | Fischer | Mar. 9, 1943 |
| 2,408,370 | Burrill | Oct. 1, 1946 |
| 2,503,812 | Fath | Apr. 11, 1950 |